United States Patent
Raaijmakers

(10) Patent No.: US 6,900,877 B2
(45) Date of Patent: May 31, 2005

(54) SEMICONDUCTOR WAFER POSITION SHIFT MEASUREMENT AND CORRECTION

(75) Inventor: Ivo Raaijmakers, Bilthoven (NL)

(73) Assignee: ASM American, Inc., Phoenix, AZ (US)

(*) Notice: Subject to any disclaimer, the term of this patent is extended or adjusted under 35 U.S.C. 154(b) by 359 days.

(21) Appl. No.: 10/170,307

(22) Filed: Jun. 12, 2002

(65) Prior Publication Data

US 2003/0231950 A1 Dec. 18, 2003

(51) Int. Cl.$^7$ .............................................. G03B 27/42
(52) U.S. Cl. ....................................................... 355/53
(58) Field of Search ........................... 355/53; 356/401; 438/14

(56) References Cited

U.S. PATENT DOCUMENTS

| | | |
|---|---|---|
| 3,907,439 A | 9/1975 | Zanoni |
| 3,945,505 A | 3/1976 | Frisbie et al. |
| 4,024,944 A | 5/1977 | Adams et al. |

(Continued)

FOREIGN PATENT DOCUMENTS

| | | |
|---|---|---|
| JP | 58-055270 | 4/1983 |
| JP | 60-024518 | 2/1985 |
| JP | 61-087352 | 6/1986 |
| JP | 61-228639 | 10/1986 |
| JP | 62-073643 | 4/1987 |

OTHER PUBLICATIONS

Sugimoto, S. et al., "Wafer loading and unloading robot," *Sharp Technical Journal*, No. 30, (1984), pp. 79–83.

Kurt Peterson et al., "High–Performance, High Precision Mass–Flow Sensor with Integrated Laminar Flow Micro–Channels," *International Conference on Solid State Sensors and Actuators—Digest of Technical Papers* (1985), pp. 361–363.

GCA Corporation, (Wafertrac1006 Advertisement), *Solid State Technology*, vol. 28, No. 1, (Jan. 1985), p. 3.

Brooks Automation, (Wafer Handling Robot), *Solid State Technology*, vol. 28, No. 1, (Jan. 1985), p. 74.

Zbigniew M. Wojcik, "A Method of Automatic Centering of Chips, Masks and Semiconductor Wafers," *Electron Technology*, (1977), vol. 10, No. 3, pp. 79–96.

IBM Technical Disclosure Bulletin, "Automatic Mask/Wafer Alignment System," (Sep. 1985), vol. 28, No. 4, pp. 1474–1479.

IBM Technical Disclosure Bulletin, "Vacuum–Compatible Low Contamination Wafer–Orientor System," (Feb. 1986), vol. 28, No. 9, pp. 4056–4058.

IBM Technical Disclosure Bulletin, "No–Edge Contact Wafer Orientor," (Jan. 1975), vol. 17, No. 8, pp. 2220–2221.

IBM Technical Disclosure Bulletin, "Front Wafer Registration Device for Batch Process Etch End–Pint Detection System," (Oct. 1977), vol. 20, No. 5, pp. 1756–1759.

Kimiyoshi Deguchi et al., " Alignment Accuracy Evaluation of X–Ray Lithography System SR–1," *Journal of the Japan Society of Precision Engineering*, (1985), vol. 51, No. 5, pp. 156–162.

(Continued)

Primary Examiner—John F. Niebling
Assistant Examiner—Andre'C. Stevenson
(74) *Attorney, Agent, or Firm*—Knobbe, Martens, Olson & Bear LLP.

(57) ABSTRACT

A method and apparatus is provided for determining substrate drift from its nominal or intended position. The apparatus includes at least two fixed reference points. The reference points can be fixed with respect to the processing tool, or with respect to the end effector. As a robotic arm moves the end effector and substrate along a path, a camera captures images of the edge of the substrate and the reference points. Two or more cameras can also be provided. A computer can then calculate positional drift of the substrate, relative to its expected or centered position on the end effector, based upon these readings, and this drift can be corrected in subsequent robotic arm movement.

27 Claims, 9 Drawing Sheets

U.S. PATENT DOCUMENTS

| | | |
|---|---|---|
| 4,148,344 A | 4/1979 | Critchell et al. |
| 4,201,378 A | 5/1980 | Hams |
| 4,228,886 A | 10/1980 | Moran |
| 4,449,885 A | 5/1984 | Hertel et al. |
| 4,457,664 A | 7/1984 | Judell et al. |
| 4,466,073 A | 8/1984 | Boyan et al. |
| 4,507,078 A | 3/1985 | Tam et al. |
| 4,523,985 A | 6/1985 | Dimock |
| 4,559,451 A | 12/1985 | Curl |
| 4,635,373 A | 1/1987 | Miyazaki et al. |
| 4,647,266 A | 3/1987 | Coad et al. |
| 4,698,511 A | 10/1987 | Sueda et al. |
| 4,705,951 A | 11/1987 | Layman et al. |
| 4,720,635 A | 1/1988 | Uga |
| 4,744,713 A | 5/1988 | Hrovath |
| 4,765,793 A | 8/1988 | Goddeau |
| 4,770,590 A | 9/1988 | Hugues et al. |
| 4,789,294 A | 12/1988 | Sato et al. |
| 4,818,169 A | 4/1989 | Schram, deceased et al. |
| 4,819,167 A | 4/1989 | Cheng et al. |
| 4,833,790 A | 5/1989 | Spencer et al. |
| 4,836,733 A | 6/1989 | Hortel et al. |
| 4,880,348 A | 11/1989 | Baker et al. |
| 4,907,035 A | 3/1990 | Galburt et al. |
| 5,044,752 A | 9/1991 | Thurfjell et al. |
| 5,162,642 A | 11/1992 | Akamatsu et al. |
| 5,194,743 A | 3/1993 | Aoyama et al. |
| 5,239,182 A | 8/1993 | Tateyama et al. |
| 5,483,138 A | 1/1996 | Shmookler et al. |
| 5,706,201 A | 1/1998 | Andrews |
| 5,706,930 A | 1/1998 | Sahoda et al. |
| 5,721,607 A * | 2/1998 | Ota .......................... 355/53 |
| 5,740,062 A | 4/1998 | Berken et al. |
| 5,768,125 A | 6/1998 | Zinger et al. |
| 5,822,213 A | 10/1998 | Huynh |
| 5,870,488 A | 2/1999 | Rush et al. |
| 5,905,850 A | 5/1999 | Kaveh |
| 5,917,601 A | 6/1999 | Shimakzki et al. |
| 5,980,194 A | 11/1999 | Freerks et al. |
| 5,995,234 A * | 11/1999 | Nishi ........................ 356/401 |
| 6,198,976 B1 | 3/2001 | Sundar et al. |
| 6,327,517 B1 | 12/2001 | Sundar |

OTHER PUBLICATIONS

ASM Europe, (Advance 400 Course Module 19), Rev. C, (Jun. 1999).

Keyence Corporation Brochure, "Laser Thrubeam Photo-electric Sensors LX2 Series," (date unknown).

\* cited by examiner

CENTERED WATER        OFF-CENTER WATER

SEMICONDUCTOR WAFER POSITION SHIFT MEASUREMENT AND CORRECTION

BACKGROUND OF THE INVENTION

1. Field of the Invention

This invention relates generally to detecting and correcting drift of a semiconductor substrate from a nominal position.

2. Description of the Related Art

During processing, a robot is commonly used to transport a substrate, such as a silicon wafer, from one location to another inside a semiconductor processing machine. Generally, wafers are transported between storage cassettes and boats or wafer holders inside a processing chamber within the semiconductor processing machine. The robot includes an end effector to pick up the wafer from the cassette, transfer and place the wafer into the processing chamber and then transfer the wafer back into its storage cassette after processing is complete.

The wafer must often be placed with great accuracy. For example, there is often little tolerance for placement of wafers in the slots of a boat for a vertical furnace. See, e.g. U.S. Pat. No. 5,407,449, by Zinger.

Another example of the need for placement accuracy is illustrated in FIG. 1. A typical wafer and a susceptor for holding the wafer within a single-wafer processing chamber are depicted therein. For a given wafer, the pocket on a susceptor into which the wafer fits generally has a diameter only slightly larger than that of the wafer. There is often a very small clearance between the edge of the wafer and the edge of the susceptor pocket. It is important that the wafer be centered in the pocket and not touch the sidewalls thereof. If the wafer has contact with the sidewalls of the pocket, local temperature changes occur, resulting in temperature gradients across the wafer. This can cause non-uniformity in process results, as most semiconductor processing depends critically on temperature. Similarly, uncentered wafers can be damaged during placement in a number of different handling situations.

The wafer does not normally change position with respect to the end effector during wafer transport. Errors in final placement of the wafer, known as "drift," are due mainly to variations in wafer position at pickup, i.e., the end effector attaches to each wafer at a slightly different location. Therefore it is necessary to correct the position of the wafer before it is placed at its destination.

Often, standalone stations are established for locating the center of a given wafer before it is picked up again by the robot, such that centered placement on the robot end effector is assured. Unfortunately, such systems require separate drop-off and pick-up operations which consume valuable processing time. It is therefore advantageous to measure and correct the wafer's position "in line" as the effector transfers the wafer from one location to another. One method of effecting this correction is by altering the drop-off point for the wafer transfer robot based on measurements of the wafer position after it is removed from the cassette.

In the prior art, there are many ways to measure the position of the wafer on the robot before the wafer is placed on the susceptor or other destination. It is desirable to avoid contact with the wafer, so optical systems are widely used. In a typical optical system, a light beam is aimed at the wafer, and sensors detect either a reflected beam or a portion of a transmitted beam as the robot moves inside the machine. Sensor data is then used to determine the wafer position.

Most methods used to correct the wafer position are based on optical through beam sensors. A typical optical sensor consists of a transmitter and a receiver. The transmitter generates an optical ray (which may or may not be within the visible spectrum) which is picked up by a receiver. If the beam is blocked by an object between the transmitter and the receiver, such as a wafer, the sensor detects the interruption and sends a signal to a computer. The computer can then extrapolate the position of the wafer based on the time and duration of interruption at the optical sensor, the speed of robot movement, and of the robot position. The actual wafer position is thus calculated and the subsequent placement operation uses this actual wafer position in order to properly place the wafer at its destination.

The accuracy of the optical measurements depends, in part, on how well the position of these optical components are known. Currently, these systems are positioned using complicated mechanical means, which are not always accurate. Moreover, typical in line wafer centering systems are rather complex and expensive, and require many sensors to be accurately positioned.

A need exists for a simple and reliable system for properly positioning wafers and other substrates during robotic transfer.

SUMMARY OF THE INVENTION

In satisfaction of this need, embodiments of the present invention provides apparatuses and methods for determining an amount of a substrate's drift from a properly centered position and for correcting the same prior to its placement at a destination.

In accordance with one aspect of the invention, a method is provided for accurately positioning a substrate within a semiconductor processing apparatus. A substrate is loaded onto an end effector coupled to a robot. The substrate and end effector are moved along a path with the robot. A first image of a first edge portion of the substrate, along with a first proximately located reference point, is captured. A second image of a second edge portion of the substrate along with a second proximately located reference point, is also captured. A difference in position of the substrate relative to an ideal substrate position is then determined by using the captured images. Any difference in position is then compensated during subsequent robot movement of the substrate.

In accordance with another aspect of the invention, an apparatus for positioning a substrate includes an end effector configured to transport the substrate along a path, at least one reference mark and at least one camera positioned to capture two images. Each image includes at least one reference mark and a different portion of an edge of the substrate. A processor is configured to calculate a difference in position of the substrate relative to an ideal substrate position, the processor receiving input from the at least one camera.

In one embodiment, at least two the reference marks are fixed to the end effector, and move together with the substrate. The reference marks are positioned near the desired portion of an edge of the substrate. In another embodiment, the reference device is at a stationary position and comprises at least one reference mark.

The processor can be comprised of a standard central processing unit, such as those sold by Intel Corporation under the Pentium™ brand name. The processor can also be comprised of a dedicated processing unit, such as an Digital Signal Processor or Microcontroller. The processor can stand alone, or be combined with other elements found in a typical computer, including RAM, a keyboard, a monitor, a hard disk, etc. Using information from the camera, the processor can calculate the drift of the substrate with respect to the reference points and adjust the movements of the robotic arm such that the substrate is correctly positioned at the destination location.

BRIEF DESCRIPTION OF THE DRAWINGS

These and other aspects of this invention will be readily apparent from the detailed description below and the appended drawings, which are meant to illustrate and not to limit the invention, and in which.

DETAILED DESCRIPTION OF THE PREFERRED EMBODIMENTS

The methods and apparatuses to correct wafer drift of the present invention will now be described with respect to preferred embodiments; however, the methods and systems of the present invention are not limited to the illustrated apparatuses. Rather, the methods and apparatuses can be used in any tool or environment in which it is necessary to place a substrate in a position with a high degree of accuracy. Moreover, the skilled artisan will readily appreciate that the formulas and specific sequences of operation described herein are merely exemplary and that variations can be made without departing from the spirit and scope of the invention.

The present invention will be more completely understood through the following detailed description, which should be read in conjunction with the attached drawings. In this description, like numbers refer to similar elements within various embodiments of the present invention.

Importance of Placement Accuracy

Figure 1:
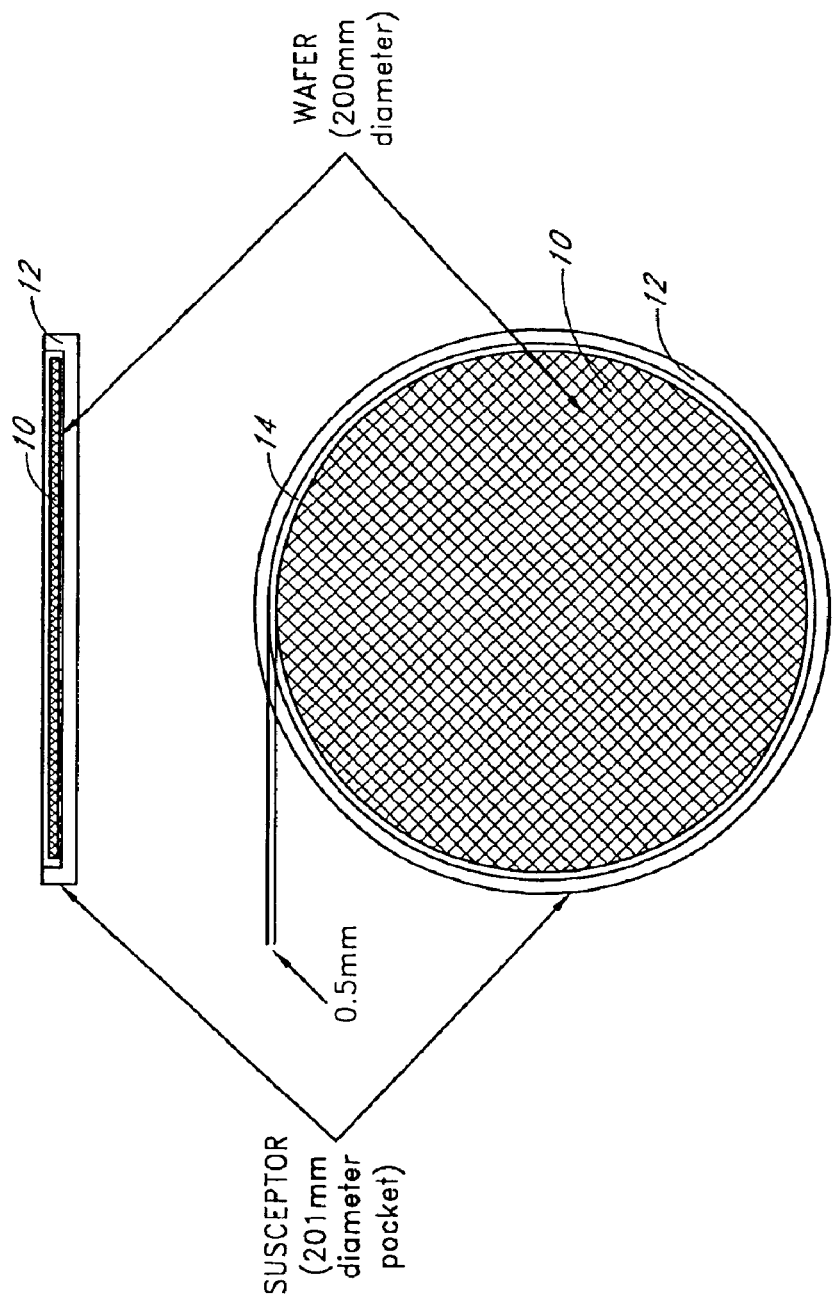
FIG. 1 is a schematic diagram showing a 200 mm wafer in place in the pocket of a wafer holder or susceptor, in both top and cross-sectional views.

FIG. 1 is a schematic diagram showing a 200 mm wafer in place in the pocket of a susceptor in both top and cross-sectional views. In this figure, a typical wafer 10 and a susceptor 12 for holding the wafer within a single-wafer processing chamber are shown. For a wafer with a diameter of 200 mm, the susceptor pocket, into which the wafer fits, has a diameter only slightly larger than that of the wafer. In the present example, the diameter of the susceptor pocket is only 201 mm. There is often a very small clearance 14, only 0.5 mm in the illustrated case, between the edge of a properly centered wafer 10 and the edge of the susceptor pocket. Susceptors for 300 mm wafers similarly have very little clearance in the wafer receiving pocket.

It is important that the wafer be centered in the pocket and not touch the sidewalls thereof. If the wafer has contact with the sidewalls of the pocket, local temperature changes occur, resulting in temperature gradients across the wafer. This can cause non-uniformity in process results, as semiconductor processing often depends critically on temperature. Similarly, uncentered wafers can be damaged during placement in a variety of different handling situations, such as during boat loading for batch systems (e.g. vertical furnaces).

Processing Apparatus

Figure 2:
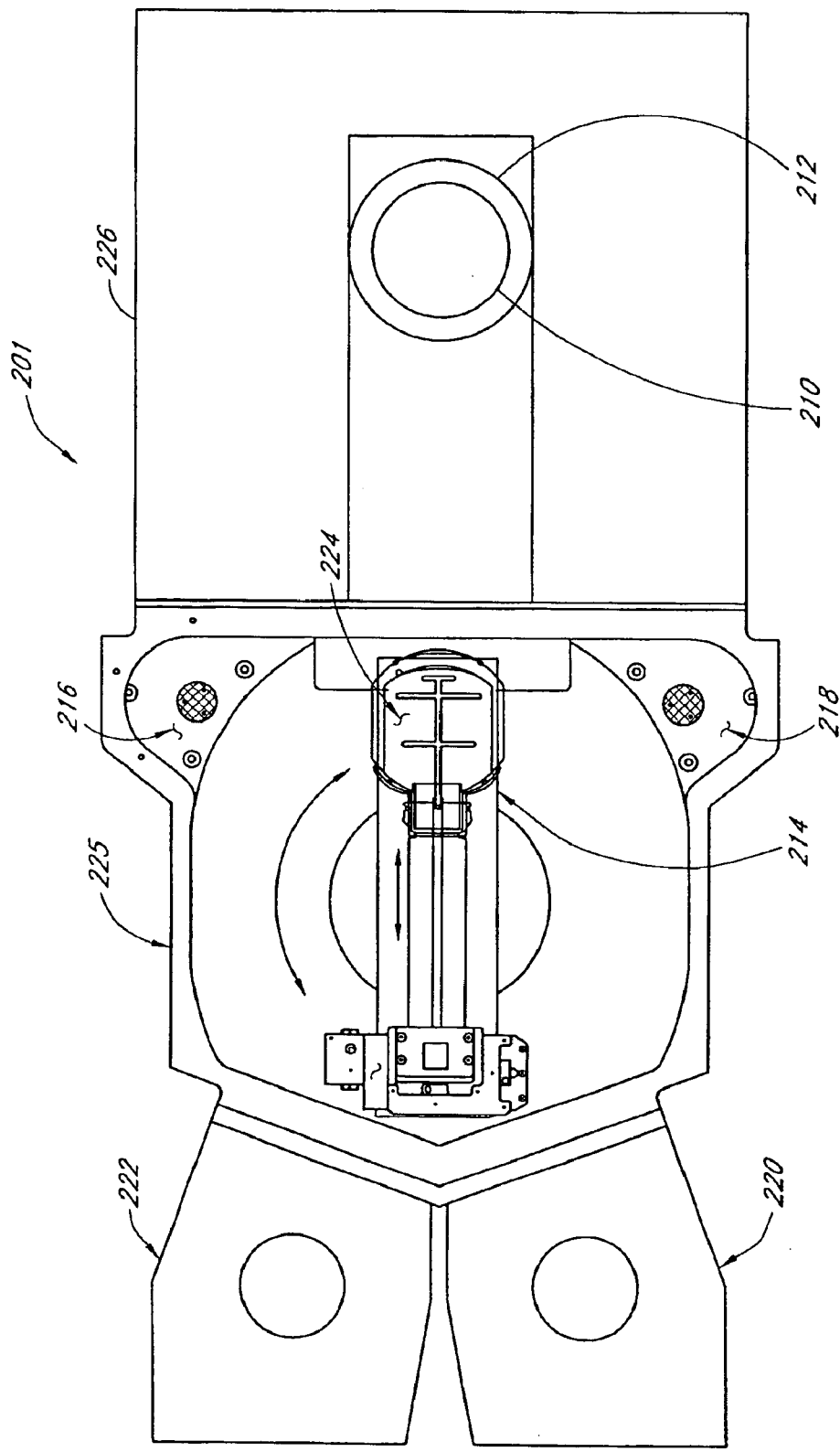
FIG. 2 is a schematic plan view of an exemplary semiconductor processing apparatus in which one embodiment of the present invention is employed.

FIG. 2 is a schematic plan view of an exemplary semiconductor processing apparatus 201 in which one embodiment of the present invention is employed. A wafer 210 is transferred by a robot 214 between various locations within the processing apparatus 201. The robot 214 includes an end effector 224, which can take the form of a paddle, fork, Bernoulli wand, suction device, gripper, etc. In the illustrated embodiment, the robot 214 is located in a wafer handling or transfer chamber 225 between load lock chambers 220, 222 and a process chamber 226. In this example, a wafer 210 can be moved among a wafer support or susceptor 212 (within the process chamber 226), cool down or staging stations 216, 218 and the load lock chambers 220, 222. Wafer processing is conducted on susceptor 212 within reaction chamber 226. Wafer staging (before processing) and cool down (after processing) are conducted at the stations 216 and 218. Preferably, at least wafer drift measurement and, more preferably, also correction for drift of the wafer 210 are performed in the wafer handling chamber 225.

Figure 3:
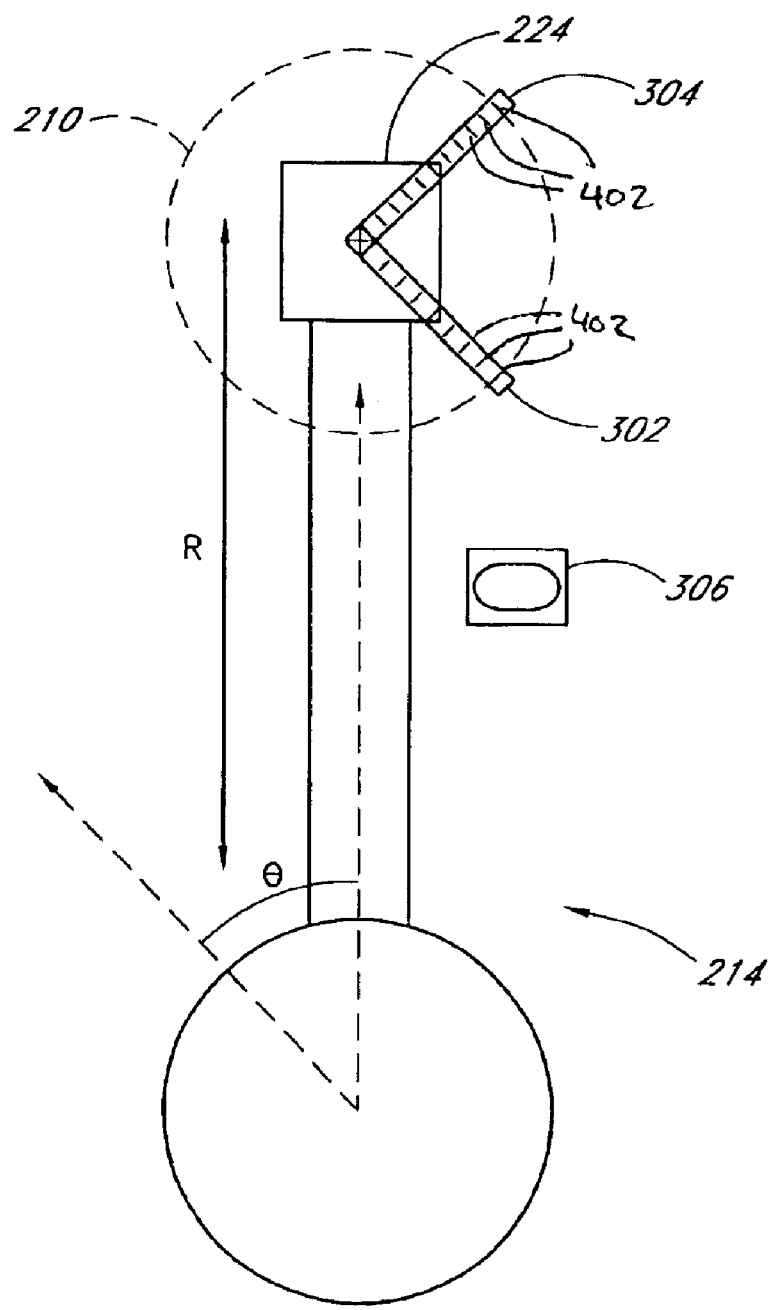
FIG. 3 is a schematic plan view of a robot according to a preferred embodiment of the present invention.

FIG. 3 shows a schematic plan view of the robot 214 and end effector 224 constructed in accordance with one embodiment of the present invention. The end effector 224 on the end of the robot 214 is connected to a reference device comprising a first reference mark holder 302 and a second reference mark holder 304, each of which extends beyond the edge of the wafer, for example outward radially from the center of the end effector 224.

Though illustrated in FIG. 3 with a series of reference marks 402 on each reference mark holder 302, 304, it will be understood in view of the embodiments discussed below that only sufficient reference marks are required to enable two images to be captured, each image including a reference mark and a different portion of the substrate edge. In some arrangements, where the mark does not move with the end effector, only one reference mark is required for this purpose. In the illustrated embodiments, where the mark(s) is (are) fixed with respect to the end effector, preferably at least two reference marks are included.

A camera 306 is placed along the path of motion of the robot 214. In the preferred embodiments, the camera 306 is comprised of a charged coupled device (CCD). A CCD is a collection of tiny light-sensitive diodes which convert photons (light) into electrons (electrical charge). Consequently, an image captured by a CCD can be stored, analyzed and manipulated by a processor (not shown). Preferably, the field of view of the CCD has a specified ratio with the image it is capturing, more preferably, this ratio is 1:1. Advantageously, this ratio allows for a 50 mm×50 mm CCD or more preferably a 20 mm×20 mm CCD or most preferably a standard 10 mm×10 mm CCD to have a field of view which is large enough to reliably capture an image of a wafer 210 and a reference mark 402 with any expected amount of drift. A camera with 256K pixels should be sufficient to determine the wafer shift with adequate accuracy.

The field of view of the camera 306 can be as small as 10 mm×10 mm because, in the preferred embodiments, the distance between the edge of the wafer 210 and each proximate reference mark 402 will be large enough to capture the reference mark 402 and the wafer 210 edge and allow for an acceptable amount of drift of the wafer 210 while the edge of the wafer 210 remains within the field of view. Advantageously, a small field of view simplifies the inclusion of the camera, an eventual light source and corresponding optics within a wafer processing apparatus without a large space requirement. In addition, it is relatively easy to install an optically transparent window in the wall of a wafer handling chamber 225 so that a CCD with a 10 mm×10 mm field of view and a light source (not shown) can be located outside of the wafer handling chamber 225

While only shown in FIG. 3, the skilled artisan will appreciate that the position of the camera(s) 306 in the FIGS. 4A–5 and 9 are represented by fields of view 406, 412, 414, 902.

Returning to FIG. 3, The end effector 224 is configured to lift a wafer 210 (shown in phantom). In particular, the camera 306 is positioned to capture two edge portions of the wafer 210 and portions of the reference mark holders 302, 304 in two images as the robot moves between two positions along the direction or axis of end effector translation. Alternatively, two separate cameras can be provided to simultaneously capture the two images. Parameter R represents the extent of extension/retraction of the end effector 224 relative to a robot origin. Parameter θ represents the angle formed by the robot arm as it rotates. Another parameter z represents vertical movement (not shown). The method and apparatus of this embodiment are described in the context of the preferred robot and coordinate system, illustrating compensation for wafer drift from a nominal wafer position by adjusting the movement of the wafer along the direction of translation R and the angle of deviation θ. The skilled artisan will appreciate, however, that the principles and advantages described herein are readily applicable to alternative coordinate systems having alternative origins.

The holders 302, 304 of FIG. 3 are shown with a series of reference marks 402. In such an arrangement, one skilled in the art will recognize that the reference marks 402 can be labeled with identifiers, such as numbers or distances, in order to accurately identify the position of each mark. Alternatively, the reference marks 402 themselves can be distinctive, so that each reference mark can be easily identified, and consequently, its exact position can be known. For example, the reference marks 402 can be arranged as a bar code, with alternating short and long bars.

Figure 4B:
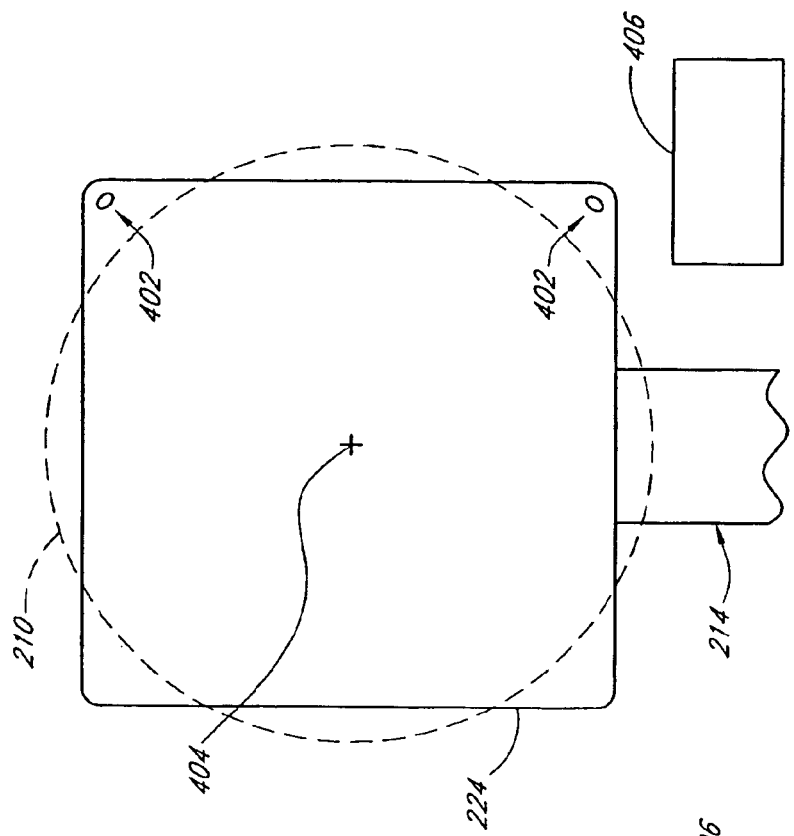
FIG. 4B is a schematic plan view of a robot end effector, constructed in accordance with another embodiment of the present invention.
Figure 4A:
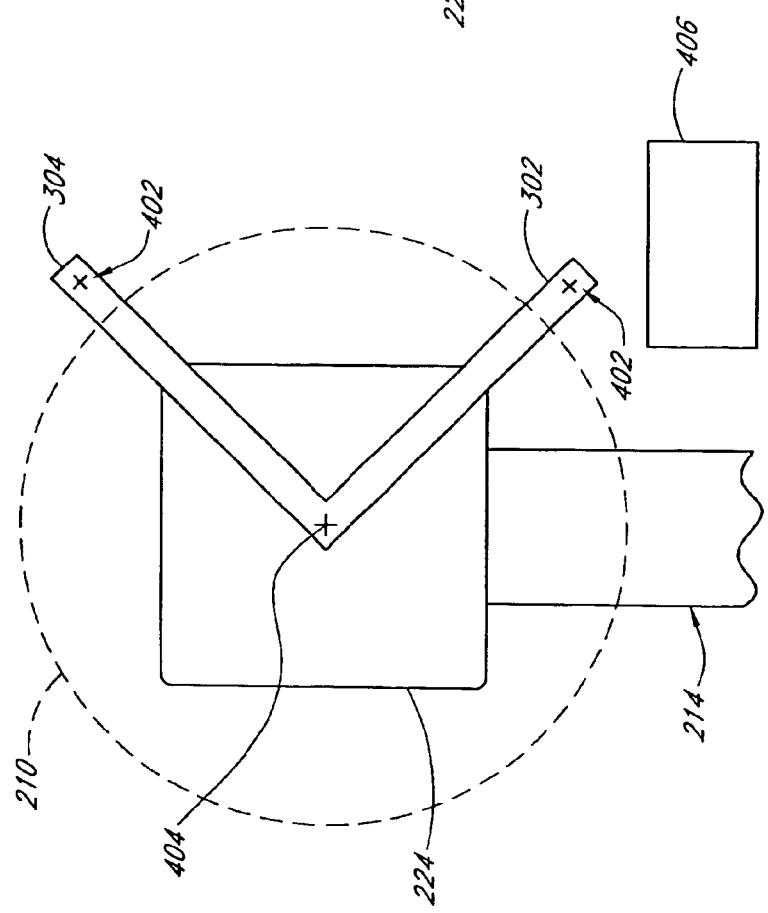
FIG. 4A is a schematic plan view of a robot end effector, constructed in accordance with one embodiment of the present invention.

FIGS. 4A and 4B show schematic plan views of two particular embodiments of the present invention. Each of the illustrated embodiments in these figures employ two marks 402 fixed with respect to the end effector 224 and a single camera. The camera is positioned to capture two images, each image including one of the reference marks and a different portion of the wafer edge, as the end effector 214 moves along its direction of translation. In other arrangements, two cameras can instead be employed to simultaneously capture these two images.

In FIG. 4A, the end effector 224 is connected to the first reference mark holder 302 and the second reference mark holder 304, which extend outward radially from the ideal wafer center point 404 of the end effector 224. The ideal wafer center point 404 represents the center point of a properly positioned wafer 210, which would not need to be adjusted for drift. In the illustrated embodiment, the reference mark holders each comprise a single reference mark 402, preferably defining a point, such as a cross mark, a circle with a small diameter or the like. In FIG. 4B, the end effector 224 is enlarged so that no separate reference mark holders are required but the reference marks 402 are provided on the end effector itself. A field of view 406 of the camera 306 (illustrated in FIG. 3) is also depicted in this embodiment. The field of view 406 is large enough so that, given any reasonable drift of the wafer 210, the camera 306 will always be able to capture an image of at least a portion of the wafer 210 along with a corresponding reference mark 402 on each reference mark holder 302, 304 as the robot 214 moves along its path. One skilled in the art will recognize that in alternate embodiments multiple reference marks can be employed such as closely spaced dots or lines, as illustrated in FIG. 3; however, in the embodiments of the remaining figures, preferably two single reference marks 402 are provided.

Figure 4C:
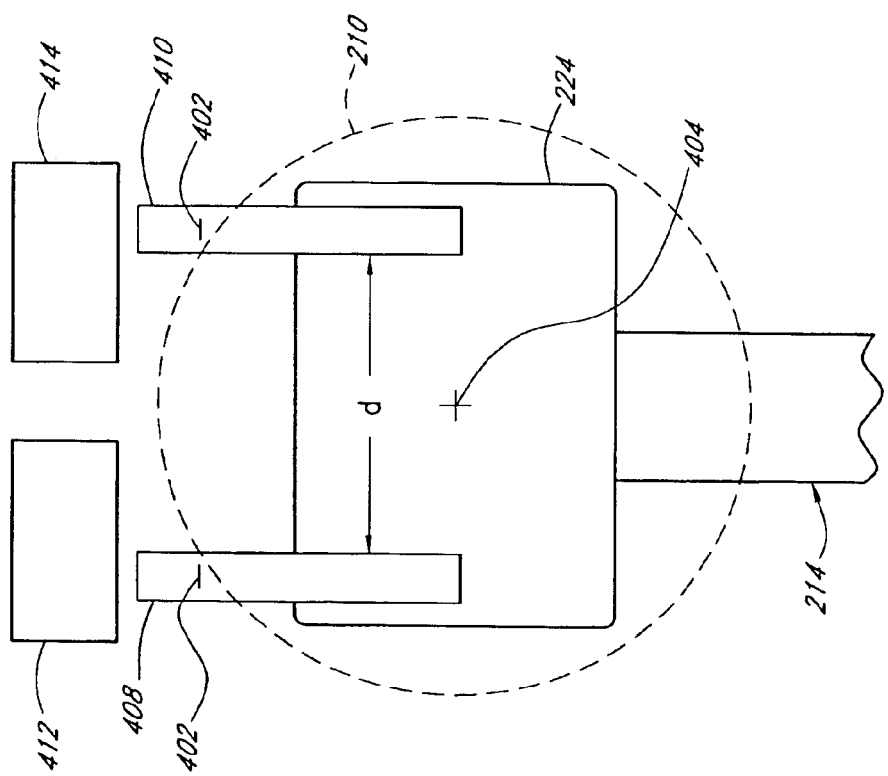
FIG. 4C is a schematic plan view of a robot end effector, constructed in accordance with another embodiment of the present invention.

FIG. 4C is a schematic plan view of a robot end effector, constructed in accordance with another embodiment of the present invention. In this embodiment, a first reference mark holder 408 and a second reference mark holder 410 are attached to the end effector 224. The reference mark holders 408, 410 extend outward from the end effector 224 and parallel to the R axis (direction of end effector translation) of the robot 214. The reference mark holders 408, 410 are separated by a distance d and are positioned with respect to the ideal wafer center point 404. On each reference mark holder 408, 410 there is at least one reference mark 402, illustrated as simple lines in this embodiment. Thus, in FIG. 4C, two reference marks 402 are positioned roughly along a line perpendicular to the path of end effector translation (R-axis).

Preferably, a first camera is positioned such that the edge of the wafer 210 and the first reference mark holder 408 will pass through the first camera's field of view 412 as the robot 214 extends or retracts. In addition, a second camera (not illustrated) is positioned such that the wafer 210 and the second reference mark holder 410 will pass through the second camera's field of view 414 as the robot 214 moves along its path. The fields of view 412, 414 are large enough so that, given any reasonable drift of the wafer 210, each camera will always be able to capture an image of at least a portion of the wafer 210 along with a corresponding reference mark 402, as the robot 214 moves along its path. In the embodiment of FIG. 4C, the system is preferably programmed to simultaneously capture two images at a point in the end effector trajectory expected to result in each image including one of the reference marks 402 and a portion of the wafer 210 edge, given any reasonable drift. As discussed below, the image capturing can be triggered in any of a number of manners.

Figure 5:
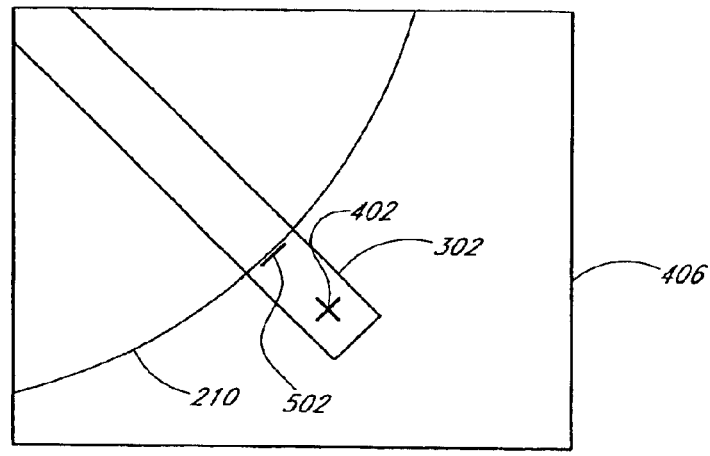
FIG. 5 depicts a field of view of a camera employed in accordance with a preferred embodiment of the invention.

FIG. 5 depicts an enlarged field of view 406 of a camera employed in accordance with a preferred embodiment of the invention. The wafer 210 is positioned with some distance between the edge of the wafer and the reference mark 402 of the reference mark holder 302. As described below, an image of this field of view 406 can be captured, stored and processed in order to determine the distance between the reference mark 402 and the edge of the wafer 210, or otherwise used to properly position the wafer 210.

Operation of the Preferred Embodiments

The operation of preferred embodiments of the present invention is described with reference to FIGS. 2–5. The end effector of the robot can pick up a wafer from any source position within the semiconductor processing apparatus 201 and move the wafer to any destination position. For example, in the apparatus of FIG. 2, both source positions and destination positions can include the reaction chamber 226, cooling station 216, or load lock chambers 220, 222, at different times throughout the process cycle for a typical wafer 210.

With reference to FIGS. 2 and 4A, in one method the end effector 224 lifts the wafer 210 from the reaction chamber 226. As the robot 214 retracts, the first reference mark holder 302 and the edge of the wafer 210 appear in the field of view 406 of the camera 306 (FIG. 3). The camera 306 is triggered and captures a first image of a first edge portion of the wafer 210 and the reference mark 402 on the first reference mark holder 302. The image is then transmitted to a processing device (not shown). As the robot arm continues to retract, the wafer 210 passes through the field of view 406 of the camera. When the second reference mark holder 304 and a second edge portion of the wafer 210 appear in the field of view 406 of the camera 306, the camera 306 is triggered again. At that point, the camera 306 captures an image of the second edge portion of the wafer 210 and the reference mark 402 on the second reference mark holder 304.

The camera 306 can be triggered to capture these images through a variety of different means. For example, the camera 306 can be triggered by the positional sensors of the robot arm or a light sensor designed to detect an edge of the wafer 210. Advantageously, the camera itself can be used as the light sensor. For example, the camera and a source of light can be disposed at opposite sides of the wafer. When no wafer is present, the light intensity detected by the camera 306 is at a maximum value. When the leading edge portion of the wafer 210 moves into the field of view 406 of the camera 306 together with a first reference mark holder 302, part of the camera is shielded from the light source by the wafer and the reference mark holder 302, resulting in a lower light intensity. Either the total light intensity detected by the camera or the number of pixels of the camera for which the light intensity is below a certain switch level can be used to trigger the camera, and thereby capture an image. Similarly, the camera can be triggered a second time when the trailing edge portion of the wafer 210, together with a second reference mark holder 304, moves out of the field of view 406 of the camera 306. The change in intensity is again detected by the camera (either overall intensity or number of pixels for which the light intensity is above a certain level), causing a second image to be captured. To facilitate sensing the wafer shadow to trigger the image capturing, the reference mark holder can be a metal strip and the reference mark 402 can be a circular hole in the strip just outside the wafer edge.

In alternate embodiments, the camera can be triggered twice by a timer, which has been set to measure the amount of time it takes the robot 214 to retract the arm to the two positions where the first reference mark holder 302 and the second reference mark holder 304, respectively, are expected to come into its field of view 406.

It will be understood that the discussion above of employing one camera triggered twice to capture two images in sequence is equally applicable to the embodiment of FIG. 4B. Similarly, a single camera can be employed in other embodiments in which two reference marks lie roughly along a line parallel to the axis of end effector translation (R-axis for the illustrated robot 214).

Furthermore, as is depicted in FIG. 4C, multiple cameras 306 can be used to capture multiple images of different fields of view 412, 414, each including at least one reference mark and a portion of the wafer edge, at the same time. Such an arrangement is particularly preferred when a line through the center of the two reference marks is not parallel (e.g., perpendicular) to the end effector axis of translation, but can also be employed for the parallel arrangements of FIGS. 4A and 4B.

Whether single or multiple reference marks 402 are used on one reference mark holder, the wafer edge could coincide with one of the reference marks so that the position of the edge of the wafer 210 corresponds precisely with the position of a proximately located reference mark 402. Alternately, there could still be some distance between the edge of the wafer 210 and the nearest reference mark 402. For example, there could be a two millimeter distance between the edge of the wafer 210 and a reference mark 402. In the preferred embodiment, the processor, through the image obtained by the CCD, will be able to accurately determine the distance between the edge of the wafer 210 and the reference mark 402. This is true of both embodiments using a reference mark series and single mark embodiments. Preferably, the distance between the wafer 210 and the reference mark 402 will be used in the calculation of drift of the wafer 210.

A substrate shift determination step is preferably carried out before placing the wafer 210 in the reaction chamber 226. The camera 306 used in the substrate shift determination step is preferably placed along the end effector's 224 path as the robot 214 extends into the reaction chamber 226. However, this is only an example of one embodiment, and the substrate shift determination step can be conducted at other locations throughout the transfer chamber 225. The skilled artisan will also appreciate that the substrate shift determination and correction operation can be conducted in other process tools and at other stages of a processing sequence. For example, substrate shift determination can be conducted immediately after removing a wafer from one of the load lock chambers 220, 222. Furthermore, the substrate shift determination and correction operation can be performed at a dedicated centering station. In a batch processing system, substrate shift correction can be useful during loading of a wafer boat prior to processing. In addition, it is not necessary to explicitly calculate the center point of the wafer 210 in order to calculate drift. One skilled in the art will recognize, in view of the description below, that drift can be calculated without explicitly deriving the center point of the wafer 210. The details of the center finding operation and a substrate shift determination operation in the preferred embodiments are described below.

Calculation of the Wafer Center Point

Preferably, once two images have been obtained which each contain an intersection point 502, a processor will analyze these images in order to calculate the center point of the wafer 210.

Figures 6A, 6B:
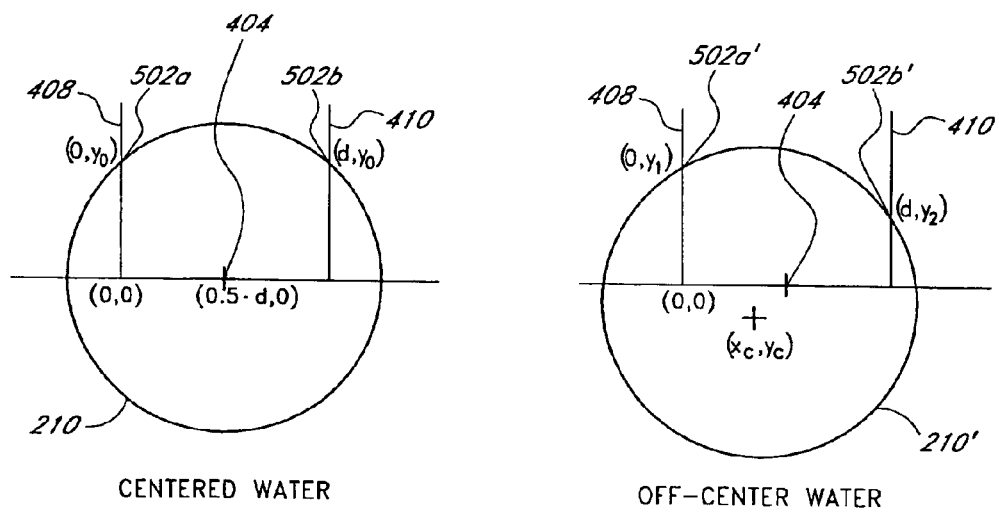
FIG. 6A depicts a properly centered wafer with respect to reference marks in accordance with one embodiment.
FIG. 6B depicts an off-center wafer with respect to the reference marks of FIG. 6A.

FIGS. 6A and 6B depict a wafer in two different positions with respect to the end effector, in order to illustrate calculations in accordance with one embodiment of the present invention. While the end effector is not shown, it will be understood that each of the ideal center point 404 and reference marks (indirectly represented by intersection points 502a, 502b and 502a', 502b' in FIGS. 6A and 6B) are fixed with respect to the end effector. In FIG. 6A, the wafer 210 is perfectly centered on the end effector with respect to the ideal wafer center point 404. In FIG. 6B, the wafer 210' has drifted, and is not properly centered with respect to the ideal wafer center point 404 of the end effector. In both FIGS. 6A and 6B, two images have been previously captured by the camera 306 and intersection points 502a, 502b and 502a', 502b', respectively, have been determined by the processor by reference to the reference marks. In these figures, "d" represents the distance between reference mark holders 408 and 410, which are configured as described above with respect to FIG. 4C. As illustrated in FIG. 6A, if the wafer 210 were perfectly centered, the coordinates of the wafer center position would be (0.5·d, 0), using the selected coordinate system. Therefore, the coordinates of the edge of the wafer 210 along the reference mark holders 408, 410 would be (0, $y_0$) and (d, $y_0$) respectively. As shown in FIG. 6B, in the case of an off-center wafer 210', the coordinates of the edge of the wafer along the reference mark holders 408, 410 are (0, $y_1$) and (d, $y_2$) respectively.

With reference to FIGS. 6A and 6B, the following description illustrates how one embodiment of the present invention calculates the center point of the off-centered wafer 210':

First, the equations for the circles centered around (0, $y_1$) and (d, $y_2$) are given:

$$R_W^2 = (x-0)^2 + (y-y_1)^2 \quad (1)$$

$$R_W^2 = (x-d)^2 + (y-y_2)^2 \quad (2)$$

The wafer center is at the intersection of these two circles.

Second, the equation for the perpendicular bisector between the points (0, $y_1$) and (d, $y_2$), which can be derived from equations (1) and (2), is:

$$y = \left(\frac{d}{y_1 - y_2}\right) \cdot x - \left(\frac{d^2 + y_2^2 - y_1^2}{2 \cdot (y_1 - y_2)}\right) \quad (3)$$

This equation can be simplified to:

$$y = a \cdot x + b \quad (3a)$$

Since the constants a and b can be calculated from the parameters d, $y_1$, and $y_2$:

$$a = \left(\frac{d}{y_1 - y_2}\right) \quad (3b)$$

$$b = -\left(\frac{d^2 + y_2^2 - y_1^2}{2 \cdot (y_1 - y_2)}\right) \quad (3c)$$

Third, combining equations (1) and (3a), or (2) and (3a), gives the equation from which the coordinates of the wafer center position can be calculated:

$$0 = (1+a^2) \cdot x^2 + (2 \cdot a \cdot b - 2 \cdot a \cdot y_1) \cdot x + (b^2 - 2 \cdot b \cdot y_1 + y_1^2 - R_W^2) \quad (4)$$

This equation can be simplified to:

$$0 = A \cdot x^2 + B \cdot x + C \quad (4a)$$

Since the constants A, B, and C can be calculated from the parameters d, $y_1$, $y_2$, a, and b, the following relation holds for the x-coordinate:

$$x_{C1} = \frac{-B + \sqrt{B^2 - 4 \cdot A \cdot C}}{2 \cdot A} \quad \text{or}$$

$$x_{C2} = \frac{-B - \sqrt{B^2 - 4 \cdot A \cdot C}}{2 \cdot A}$$

And for the y-coordinate:

$$y_{C1} = a \cdot x_{C1} + b$$

or $$y_{C2} = a \cdot x_{C2} + b$$

From these two solutions, ($x_{C1}$, $y_{C1}$) and ($x_{C2}$, $y_{C2}$), only one can be the actual wafer center position:

| | |
|---|---|
| in the case where $y_1 > y_2$: | the center position is ($x_{C2}$, $y_{C2}$). |
| in the case where $y_1 < y_2$: | the center position is ($x_{C1}$, $y_{C1}$). |
| in the case where $y_1 = y_2$: | the center position is $(0.5d, y_1 - \sqrt{R_W^2 - 0.25 \cdot d^2})$. |

The above procedure for calculating the wafer center position can always be used when the coordinates of two wafer edge positions are known. Instead of the known positions (0, $y_1$) and (d, $y_2$) used in the preferred embodiment, alternatively known positions such as ($x_1$, $y_1$) and ($x_2$, $y_2$) would also be acceptable. The skilled artisan will also appreciate that any coordinate system can be used in alternative embodiments of the present invention. Preferably, the coordinate system chosen is relative to the end effector itself.

Calculating Wafer Drift Without Determining the Wafer Center Point

In another embodiment, the shift of the wafer 210 is determined without calculating the wafer's center point. This will be explained with reference to FIGS. 7 and 8.

Figure 7:
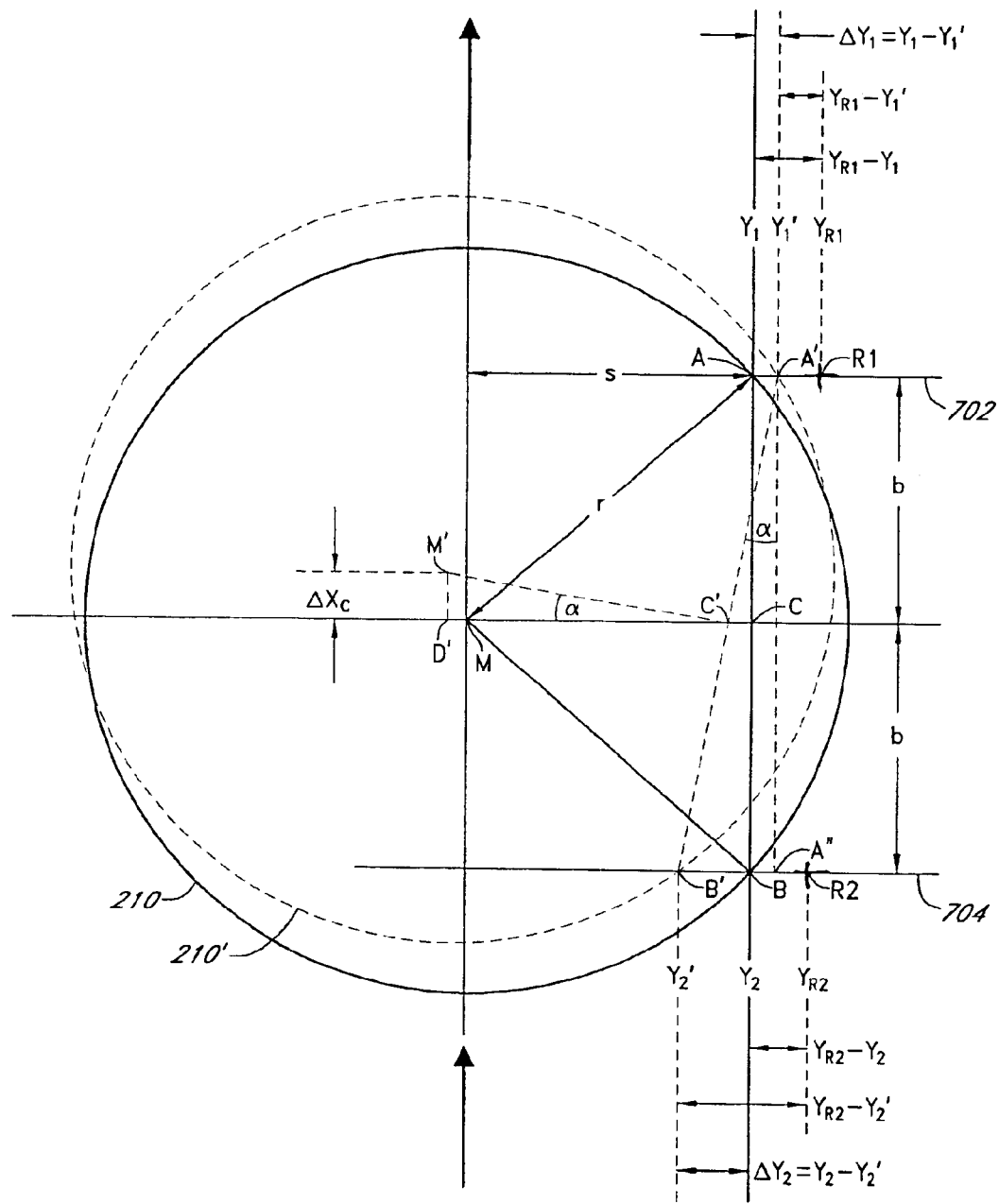
FIG. 7 depicts a wafer and an off-center wafer in accordance with another embodiment of the present invention.

FIG. 7, depicts a wafer in two different positions with respect to the end effector, in order to illustrate calculations in accordance with another embodiment of the present invention. While the end effector is not shown, it will be understood that each of the two reference marks $R_1$, $R_2$, are located on reference mark holders 702, 704 which are attached to the end effector and located just outside the edge of the wafer 210.

In this embodiment, the system is initially calibrated by positioning the wafer 210 in an ideal position on the end effector. A camera 306 (depicted in FIG. 3) is positioned along the path of movement of the wafer 210, as indicated. As the wafer 210 is moved, two images are captured, one when reference mark R1 (and the first wafer edge portion) is within the field of view of the camera 306, and the second when reference mark R2 (and the second wafer edge portion) is within the field of view of the camera 306. The distances between the reference marks R1, R2 and the edge portions of the wafer 210 are then determined. Preferably, this distance is determined in a direction perpendicular to the path of movement of the wafer 210. When the camera 306 is oriented such that one axis of the rectangular matrix of pixels of the camera 306 is in the direction of movement of the wafer (the X direction), and the other axis (the Y direction) is oriented perpendicular to the path of movement of the wafer 210, the distance between a reference mark R1, R2 and each edge portion of the wafer 210 can then simply be determined by counting the number of pixels in this direction between the identified reference mark and the corresponding wafer edge portion. This information is then stored by the processor for comparison with non-ideally positioned wafers.

In this embodiment, the edge of the ideally positioned wafer 210 intersects with the reference mark holders 702, 704 at points A and B, respectively, and the distance between reference mark holder 702 and reference mark holder 704 is 2*b (known). The edge of an off-center wafer 210' intersects with reference mark holders 702, 704 at A' and B'. The drift of the off-center wafer 210' is then compared to the ideally positioned wafer 210, in both the X direction ($\Delta X$) and in the Y direction ($\Delta Y$) with respect to the reference points R1, R2. Hence the required position correction can now be easily calculated without the explicit calculation of the position of the wafer center. For small shifts in position, the shift of the wafer center ($\Delta Y_c$) in the Y direction can be calculated as the average shift (as measured by the camera) of the points at which the wafer intersects with the reference mark holder:

$$\Delta Y_c = [\Delta Y_1 + \Delta Y_2]/2 \quad (5)$$

More calculation is required to determine the drift in the X-direction. For two points on the edge of the wafer 210, the position is determined: for the ideal wafer the points A and B and for the shifted wafer the points A' and B'. The lines AB and A'B' are chords along the circumference of the circle with known radius r. In comparison with the ideal wafer, the orientation of the chord has been changed over an angle $\alpha$ (see triangle A', A"B') where:

$$\text{Tan}(\alpha) = [\Delta Y_1 - \Delta Y_2]/2b \quad (6)$$

The center of a circle can be found on the normal through the middle of a chord. In the case of the off-center wafer 210', a normal to chord AB intersects chord A'B' at point C'. We assume, for small shifts in wafer position, that the angle $\alpha$ is small, that the length of the chord A'B' is still 2b and that the distance from the shifted center M' of the wafer to point C' is s. The shift of the off-center wafer 210' position in the X-direction is then given by the equation:

$$\Delta X_c = \text{Tan}(\alpha)^* s = [\Delta Y_1 - \Delta Y_2]^* [s/2b] \quad (7)$$

herein, s can be substituted as:

$$s = \sqrt{r^2 - b^2} \quad (8)$$

We have now expressed the shift in position of the wafer in both the Y and X directions in the quantities $\Delta Y_1$ and $\Delta Y_2$ and b without a need to know the exact position of the wafer center. The quantities $\Delta Y_1$ and $\Delta Y_2$ are in a simple way related to the measured distances between reference points $R_1$ and $R_2$ and the wafer edge:

$$\Delta Y_1 = (Y_{R1} - Y_1) - (Y_{R1} - Y_1') \quad (8a)$$

$$\Delta Y_2 = (Y_{R2} - Y_2) - (Y_{R2} - Y_2') \quad (8b)$$

Figure 8:
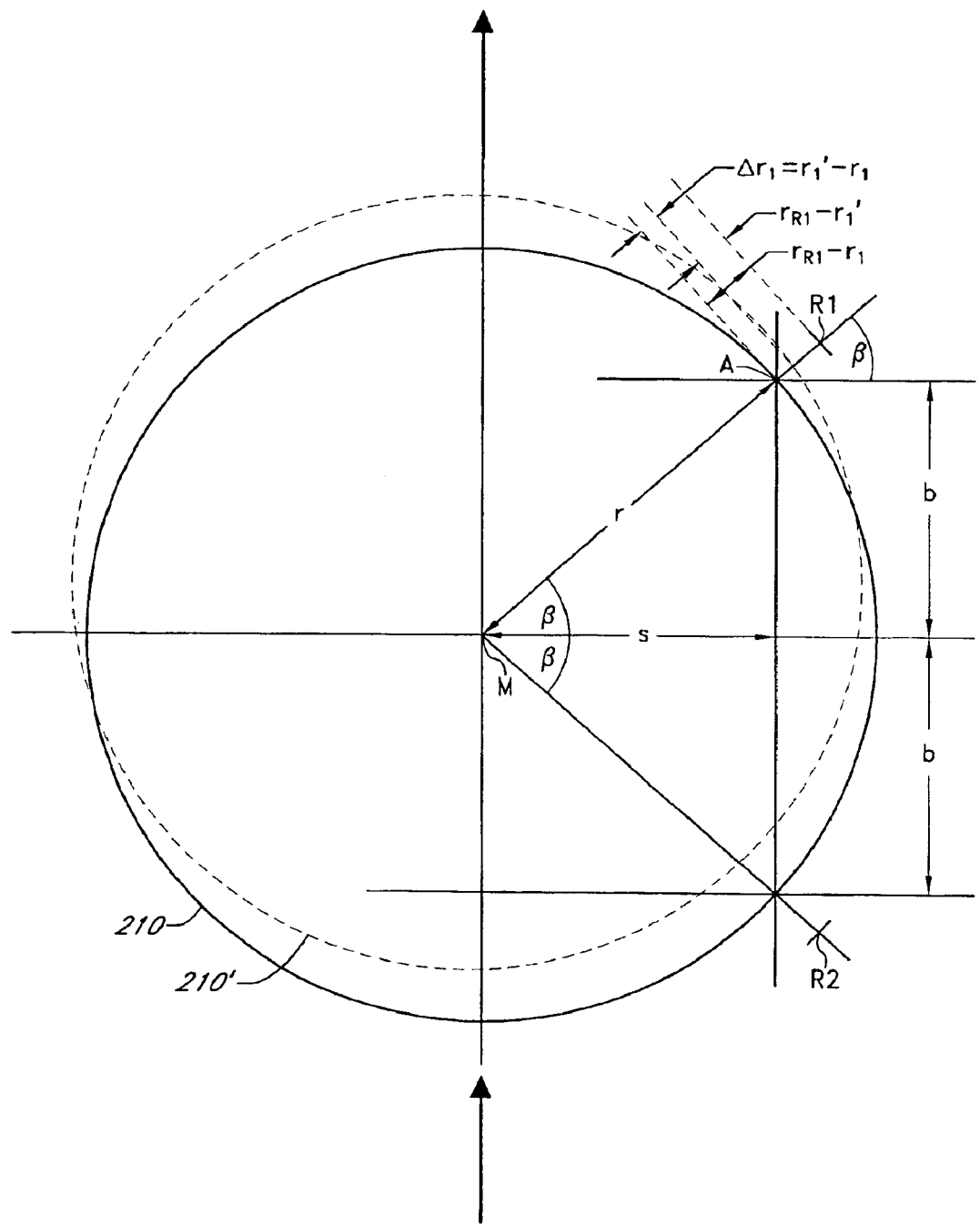
FIG. 8 depicts a wafer and an off-center wafer in accordance with another embodiment of the present invention.

In another embodiment, the distance between a reference point R1 and the edge of the wafer 210 can be determined in the radial direction as shown in FIG. 8. The obtained value $\Delta r_1$ can easily be converted into a $\Delta Y_1$ value according to:

$$\Delta Y_1 = \Delta r_1 * \cos(\beta) = \Delta r_1 * s/r = \Delta r_1 * \sqrt{(r^2 - b^2)} * 1/r \quad (9)$$

Similarly, for the second reference point R2, a $\Delta Y_2$ value can be obtained from a $\Delta r_2$ value. From these $\Delta Y_1$ and $\Delta Y_2$ values, the shift in wafer position can easily be calculated according to the formulas (5) through (8) given above.

It will be clear for a person skilled in the art that the direction in which the distance between a reference mark and the wafer edge is measured and the direction in which the corresponding reference holder extends, do not need to coincide. For example the two reference marks R1 and R2 as shown in FIG. 7 can be mounted on reference holders of any shape, attached to the end effector (not shown in FIG. 7) in any feasible way.

Adjustment for Wafer Drift

Once the center point of the off-centered wafer 210' has been obtained, or the shift has been determined, the robot 214 can be adjusted to compensate for the drift and accurately position the wafer for later processing. Thus, adjustments to the path of the robot 214 are calculated. In the illustrated embodiment, these adjustments take the form of adjustments to the robot position parameters R and $\theta$, or as adjustments in whatever coordinate system is used to control the robot 214.

Correction of drift can alternatively be performed at a staging or cool down station 216, 218 or any other station used for centering purposes where the substrate can be laid down. An example thereof is adjustment to the pick-up operation after dropping the wafer at the staging or cool down station so that after pick-up the substrate is exactly on center.

Notch/Flat Detection

Today's SEMI standard calls for wafers with one notch or flat. If desired, the apparatus described herein can be arranged to accommodate wafers with notches or flats at the front edge or trailing edge of the wafer. Preferably, the wafers are arranged such that the notch or flat does not overlap with either of the reference marks. If the notch or flat does happen to overlap with one of the reference mark holders, the apparatus can still calculate the wafer's center or drift.

Figure 9:
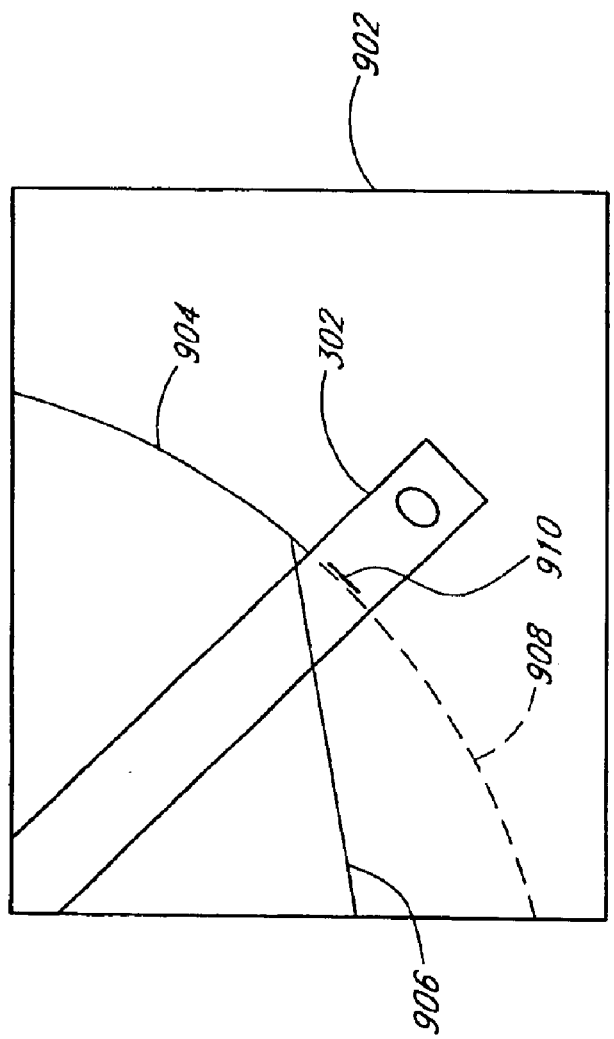
FIG. 9 depicts an enlarged image of a wafer with a flat, taken with a camera employed in accordance with a preferred embodiment of the present invention.

FIG. 9 illustrates how one embodiment of the present invention can handle a wafer 904 with a flat 906 at the wafer edge interception with a reference mark holder 302. After the camera 306 captures an image 902 of a wafer 904 with a flat 906, the camera transmits the image to a processor (not shown). The processor then uses standard graphical analysis techniques to map the edge of the wafer 904. It will be relatively easy to recognize if the edge of the wafer 210 is circular, or comprises a flat or a notch. If the X,Y positions of the pixels at the edge of the wafer 210 fit the equation of a circle, then there is no notch or flat. For each image, a check on the presence of a flat of notch will be performed. Upon recognition of the flat 906, or a notch, the processor algorithmically extrapolates the circular part of the edge of the wafer 904 and generates a virtual edge 908. The processor can then estimate an intersection point 910 at which the virtual wafer edge 908 would intersect the reference mark holder 302. With this intersection point 910, the processor can then compute the distance between the reference point 402 and the (virtual) wafer edge and compensate for its drift, if any, as described previously.

Although the reference marks 402 are attached to the robot end effector 224 and move together with the wafer 210 in each of the above illustrated embodiments, in an alternative embodiment (not shown), one or more reference marks 402 can be placed at a fixed position, such as a staging or cool-down station. As the robot 214 transports the wafer 210 to a first preprogrammed position, a first portion of the edge of the wafer 210 would enter the field of view 406 of a camera, together with a reference mark 402, and a first image would be captured. As the robot 214 continues along its path, a second portion of the edge of the wafer 210 edge would enter the field of view 406 of the same camera, together with the same reference point 402, for a second image to be captured. The calculation of drift is very similar to the calculations given above with the difference that the distance between the reference points should be replaced by the distance between the first and second positions of the robot 214. Accordingly, the processor communicates with the robot or the robot controller to determine the first and second positions for use in calculating the wafer position or drift. Rather than moving with the end effector, reference mark(s) in accordance with this embodiment are fixed with respect to the apparatus and fixed with respect to the camera. Advantageously, only one reference mark and one camera are required to capture two images with sufficient information, although two cameras, each with its own fixed reference mark, can alternatively be employed.

There are a number of advantages produced by embodiments of the present invention. One advantage of the method of wafer centering in accordance with the present invention is that the approach has been derived and proven rigorously in mathematics and is not empirical. The calculations require only a minimum number of independent variables that are easy to measure accurately, ensuring that the result is accurate. The method is reliable. It does not require complicated software or complicated mechanical adjustments. Furthermore, in the illustrated embodiments where reference marks are fixed with respect to the end effector, the system does not have to determine the absolute position of the robot 214 at the time the images are taken, and thus no complicated calibration and verification processes are necessary. The hardware is all commercially available, inexpensive, compact and easy to install. The methods are flexible because drift is detected and corrected by comparison to the designated ideal wafer center point 404 of the end effector 224, rather than absolute wafer position measurements which are heavily reliant upon the robot, its position and its spatial relation to fixtures in the tool. The methods do not require any particular transport robot, nor any real-time signal acquisition. Finally, existing wafer processing equipment can be easily retrofitted with the apparatus.

It will be appreciated by those skilled in the art that various omissions, additions and modifications can be made to the processes described above without departing from the scope of the invention, and all such modifications and changes are intended to fall within the scope of the invention, as defined by the appended claims.

I claim:

1. An apparatus for positioning a substrate, comprising:
   an end effector configured to transport the substrate along a path;
   at least one reference mark;
   at least one camera positioned to capture two images, each image including at least one reference mark and a different portion of an edge of the substrate; and
   a processor configured to calculate a difference in position of the substrate relative to an ideal substrate position, the processor receiving input from the at least one camera.

2. The apparatus of claim 1 wherein the at least one reference mark comprises at least two reference marks fixed with respect to the end effector.

3. The apparatus of claim 2 wherein each of the at least two reference marks are provided directly on the end effector.

4. The apparatus of claim 2 wherein each of the at least two reference marks is provided on a reference mark holder attached to the end effector.

5. The apparatus of claim 2 wherein each of the at least two reference marks comprises a series of reference markings.

6. The apparatus of claim 2 wherein the at least two reference marks are spaced along a line substantially perpendicular to the path.

7. An apparatus for positioning a substrate, comprising;
   an end effector configured to transport the substrate along a path;
   at least one reference mark;
   at least one camera positioned to capture two images, each image including at least one reference mark and a different portion of an edge of the substrate, whereung the at least one camera has no more than a 50 mm×50 mm field of view; and a processor configured to calculate a difference in position of the substrate relative to an ideal substrate position, the processor receiving input from the at least one camera.

8. The apparatus of claim 7 wherein the at least one camera has no more than a 20 mm×20 mm field of view.

9. The apparatus of claim 8 wherein the at least one camera has no more than a 10 mm×10 mm field of view.

10. The apparatus of claim 1 wherein the at least one camera is a charge coupled device.

11. An apparatus for positioning a substrate, comprising:
    an end effector configured to transport the substrate along a path;
    at least one reference mark;
    at least one camera positioned to capture two images, each image including at least one reference mark and a different portion of an edge of the substrate, wherein the at least one camera is triggered by a sensor which detects the presence or absence of the substrate within a field of view of the camera; and
    a processor configured to calculate a difference in position of the substrate relative to an ideal substrate position, the processor receiving input from the at least one camera.

12. An apparatus for positioning a substrate, comprising:
    an end effector configured to transport the substrate along a path;
    at least one reference mark;
    at least one camera positioned to capture two images, each image including at least one reference mark and a different portion of an edge of the substrate, wherein the at least one camera is triggered by a timer; and
    a processor configured to calculate a difference in position of the substrate relative to an ideal substrate position, the processor receiving input from the at least one camera.

13. The apparatus of claim 1 wherein the at least one camera comprises a charge coupled device that is triggered by a change in pixel values corresponding to the presence or absence of the substrate.

14. The apparatus of claim 13 wherein the charge coupled device is triggered by a certain number of pixels registering a light intensity above or below a certain threshold level.

15. The apparatus of claim 13 wherein the charge coupled device is triggered by an overall light intensity detected by the charge coupled device crossing a certain threshold level.

16. The apparatus of claim 1 wherein the at least one camera comprises a first camera positioned to capture an image of a second reference mark.

17. The apparatus of claim 16 wherein the first camera and the second camera capture their respective images at about the same time.

18. The apparatus of claim 1 wherein the processor is configured to calculate a distance between the substrate edge and one of the reference marks.

19. The apparatus of claim 1 wherein the processor is configured to calculate the difference in position of the substrate relative to the ideal substrate position without calculating an actual wafer center point.

20. An apparatus for positioning a substrate, comprising:
an end effector configured to transport the substrate along a path;
at least one reference mark;
at least one camera positioned to capture two images, each image including at least one reference mark and a different portion of an edge of the substrate; and
a processor configured to calculate a difference in position of the substrate relative to an ideal substrate position, the processor receiving input from the at least one camera, wherein the processor is configured to calculate a center point for the substrate and a drift of the substrate with respect to an ideal center point on the end effector.

21. The apparatus of claim 1 wherein the processor is configured to calculate positional changes for compensating for the calculated difference in position.

22. The apparatus of claim 21 wherein the processor is configured to instruct a robot connected to the end effector in response to the calculated positional changes.

23. The apparatus of claim 1 wherein the processor is configured to identify a flat or notch on the substrate.

24. The apparatus of claim 23 wherein the processor is configured to interpolate a virtual edge for the substrate near a reference mark when a flat or notch is identified.

25. The apparatus of claim 1 wherein the at least one reference mark is fixed with respect to the at least one camera.

26. An apparatus for positioning a substrate, comprising:
an end effector configured to transport the substrate along a path;
at least two reference marks fixed with respect to the end effector;
at least one camera positioned to capture two images, each image including one of the reference marks and a different portion of an edge of the substrate; and
a processor configured to calculate a position of the substrate relative to the reference marks, the processor receiving input from the at least one camera.

27. The apparatus of claim 26, wherein the at least on camera comprises a single camera positioned to capture the two images as the end effector travels along the path.

* * * * *